(12) United States Patent
Lee et al.

(10) Patent No.: US 9,628,100 B2
(45) Date of Patent: Apr. 18, 2017

(54) ANALOG-TO-DIGITAL CONVERSION DEVICE FOR MULTIPLE INPUT SIGNALS AND CONVERSION METHOD THEREFOR

(71) Applicant: CESIGN CO., LTD., Seongnam-si (KR)

(72) Inventors: Soo Hyoung Lee, Hwaseong-si (KR); Yun Mi Na, Seongnam-si (KR); Hui Kwan Yang, Yongin-si (KR)

(73) Assignee: CESIGN CO., LTD., Seongnam-si (KR)

( * ) Notice: Subject to any disclaimer, the term of this patent is extended or adjusted under 35 U.S.C. 154(b) by 0 days.

(21) Appl. No.: 15/217,029

(22) Filed: Jul. 22, 2016

(65) Prior Publication Data

US 2017/0070235 A1    Mar. 9, 2017

(30) Foreign Application Priority Data

Sep. 4, 2015    (KR) .................. 10-2015-0125255

(51) Int. Cl.
*H03M 1/00* (2006.01)
*H03M 1/12* (2006.01)

(52) U.S. Cl.
CPC ................... *H03M 1/1245* (2013.01)

(58) Field of Classification Search
CPC .................................................. H03M 1/1245
USPC .................................. 341/122, 141, 155
See application file for complete search history.

(56) References Cited

U.S. PATENT DOCUMENTS

| 3,699,325 | A | * | 10/1972 | Montgomery, Jr. | ... G01V 1/245 341/122 |
| 4,677,422 | A | * | 6/1987 | Naito | .......... H03M 1/1215 341/122 |
| 8,416,110 | B2 | * | 4/2013 | Tsai | ............. G11C 27/024 341/122 |
| 8,742,963 | B2 | * | 6/2014 | Zou | ............. H03M 1/1215 341/141 |
| 8,836,556 | B2 | * | 9/2014 | Liu | ............. H03M 1/1245 341/118 |

FOREIGN PATENT DOCUMENTS

| KR | 1019990025156 | 4/1999 |
| KR | 1020060058791 | 6/2006 |

* cited by examiner

*Primary Examiner* — Khai M Nguyen
(74) *Attorney, Agent, or Firm* — Cantor Colburn LLP

(57) ABSTRACT

An analog-to-digital conversion device for multiple input signals includes a sample-and-hold amplifier and an analog-to-digital converter for converting an analog signal output from the sample-and-hold amplifier into a digital signal. According to the analog-to-digital conversion device for multiple input signals and a conversion method therefor, even if an input buffer is not provided, the dynamic range of the analog-to-digital converter may be optimally set depending on the input signals, and current consumption may be reduced.

16 Claims, 5 Drawing Sheets

ANALOG-TO-DIGITAL CONVERSION DEVICE FOR MULTIPLE INPUT SIGNALS AND CONVERSION METHOD THEREFOR

BACKGROUND OF THE INVENTION

1. Field of the Invention

The present invention relates generally to an analog-to-digital conversion device for multiple input signals and a conversion method therefor. More particularly, the present invention relates to an analog-to-digital conversion device for multiple input signals and a conversion method therefor, which may limit the use of an input buffer and set a dynamic range by controlling the amplification gain and bias current of a sample-and-hold amplifier.

2. Description of the Prior Art

FIG. 1 shows a configuration diagram of a conventional analog-to-digital conversion device 100 for multiple input signals.

As shown in FIG. 1, in the conventional analog-to-digital conversion device 100, multiple input signals are stabilized using respective buffers 110 and are input to a multiplexer 120.

The multiplexer 120 selects one from among the multiple signals, output from the multiple buffers, based on control information from a controller 150, and then inputs the selected signal to a sample-and-hold amplifier (SHA) 130. Then, the signal output from the SHA 130 is converted into a digital signal by an analog-to-digital converter (ADC) 140.

Here, the ADC 140 outputs a signal corresponding to a dynamic range, which is fixed using a fixed reference voltage output from a reference signal generator 160.

In other words, in the conventional analog-to-digital conversion device 100 for multiple input signals, because multiple input buffers 110 are required and the dynamic range of the analog-to-digital converter 140 is fixed, signals may be distorted and it is difficult to optimize current.

SUMMARY OF THE INVENTION

Accordingly, the present invention has been made keeping in mind the above problems occurring in the related art, and an object of the present invention is to provide an analog-to-digital conversion device for multiple input signals and a conversion method therefor, which may optimally set the dynamic range of an analog-to-digital converter depending on the input signals and reduce the consumption of current, even if input buffers are not provided therein.

An analog-to-digital conversion device includes a sample-and-hold amplifier and an analog-to-digital converter for converting an analog signal, output from the sample-and-hold amplifier, into a digital signal, wherein an amplification gain of the sample-and-hold amplifier is controllable.

Specifically, the sample-and-hold amplifier includes an input capacitor, located in an input terminal, and a negative feedback capacitor, which forms a negative feedback path in a direction from an output terminal to the input terminal, wherein at least one of the input capacitor and the negative feedback capacitor may be a capacitor bank that includes multiple capacitors, which are connected in parallel with each other.

Also, desirably, the amplification gain of the sample-and-hold amplifier is controllable by controlling an on/off operation of a switch connected to each of the multiple capacitors, connected in parallel with each other in the capacitor bank.

Desirably, the amplification gain of the sample-and-hold amplifier is controllable using a swing range of multiple input signals, which are input to the analog-to-digital conversion device, or a swing range of a signal input to the sample-and-hold amplifier. Specifically, it is desirable for the amplification gain of the sample-and-hold amplifier to decrease with an increase in the swing range of the multiple input signals, which are input to the analog-to-digital conversion device, or an increase in the swing range of the signal input to the sample-and-hold amplifier.

Also, at least one of a bias current of the sample-and-hold amplifier and a current that flows in an output buffer of the sample-and-hold amplifier is controllable. Specifically, when the amplification gain of the sample-and-hold amplifier decreases, at least one of the bias current of the sample-and-hold amplifier and the current that flows in the output buffer of the sample-and-hold amplifier may be controlled so as to decrease. Also, when the amplification gain of the sample-and-hold amplifier increases, at least one of the bias current of the sample-and-hold amplifier and the current that flows in the output buffer of the sample-and-hold amplifier may be controlled so as to increase.

Desirably, the analog-to-digital conversion device of the present invention further includes a reference signal generator for generating a reference voltage that is capable of being used to set a dynamic range of the analog-to-digital converter, wherein the reference voltage may be adjusted depending on a swing range of a signal output from the sample-and-hold amplifier. Specifically, when the swing range of the signal output from the sample-and-hold amplifier decreases, the reference voltage may be adjusted so as to decrease the dynamic range of the analog-to-digital converter, and when the swing range of the signal output from the sample-and-hold amplifier increases, the reference voltage may be adjusted so as to increase the dynamic range of the analog-to-digital converter.

An analog-to-digital conversion method according to an embodiment of the present invention uses an analog-to-digital conversion device, which includes a sample-and-hold amplifier and an analog-to-digital converter, and includes (a) sampling and holding a signal using the sample-and-hold amplifier; and (b) converting an analog signal, output at (a), into a digital signal using the analog-to-digital converter.

Also, (a) may include (a-1) controlling an amplification gain of the sample-and-hold amplifier, and (a-2) controlling at least one of a bias current of the sample-and-hold amplifier and a current that flows in an output buffer of the sample-and-hold amplifier.

Desirably, (a-1) may be configured such that the amplification gain of the sample-and-hold amplifier is controlled using a swing range of multiple input signals, which are input to the analog-to-digital conversion device, or a swing range of a signal input to the sample-and-hold amplifier. Also, (a-1) may be configured such that the amplification gain of the sample-and-hold amplifier is decreased with an increase in the swing range of the multiple input signals, which are input to the analog-to-digital conversion device, or an increase in the swing range of the signal input to the sample-and-hold amplifier.

Desirably, (a-2) may be configured such that when the amplification gain of the sample-and-hold amplifier decreases, at least one of the bias current of the sample-and-hold amplifier and the current that flows in the output buffer of the sample-and-hold amplifier is controlled so as to decrease. Also, (a-2) may be configured such that when the amplification gain of the sample-and-hold amplifier increases, at least one of the bias current of the sample-andhold amplifier and the current that flows in the output buffer of the sample-and-hold amplifier is controlled so as to increase.

Desirably, the analog-to-digital conversion method of the present invention further includes (c) generating a reference voltage that is capable of being used to set a dynamic range of the analog-to-digital converter, wherein the reference voltage may be adjusted depending on a swing range of a signal output from the sample-and-hold amplifier. Specifically, when the swing range of the signal output from the sample-and-hold amplifier decreases, the reference voltage may be adjusted so as to decrease the dynamic range of the analog-to-digital converter, and when the swing range of the signal output from the sample-and-hold amplifier increases, the reference voltage may be adjusted so as to increase the dynamic range of the analog-to-digital converter.

The analog-to-digital conversion device for multiple input signals and the conversion method therefor according to the present invention may optimally set the dynamic range of an analog-to-digital converter depending on the input signals and may reduce the consumption of current, even if input buffers are not provided therein.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE EXEMPLARY EMBODIMENTS

Hereinafter, an analog-to-digital conversion device for multiple input signals and a conversion method therefor according to an embodiment of the present invention will be described in detail with reference to the accompanying drawings.

The embodiment described below is provided merely to embody the present invention, but the present invention is not limited thereto. Matters that those skilled in the art can easily infer from the detailed description and embodiment of the present invention are construed as falling within the scope of rights of the present invention.

Figure 1:
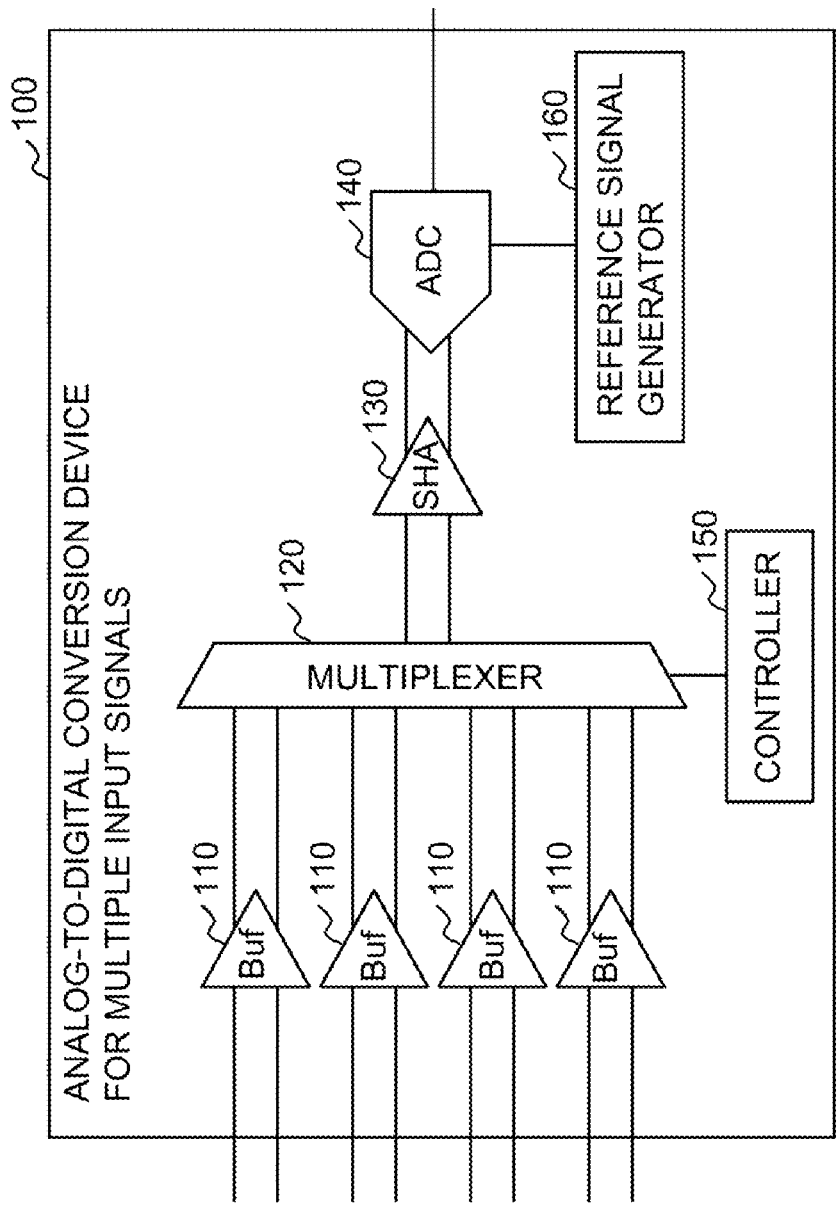
FIG. 1 is a configuration diagram of a conventional analog-to-digital conversion device for multiple input signals.
Figure 2:
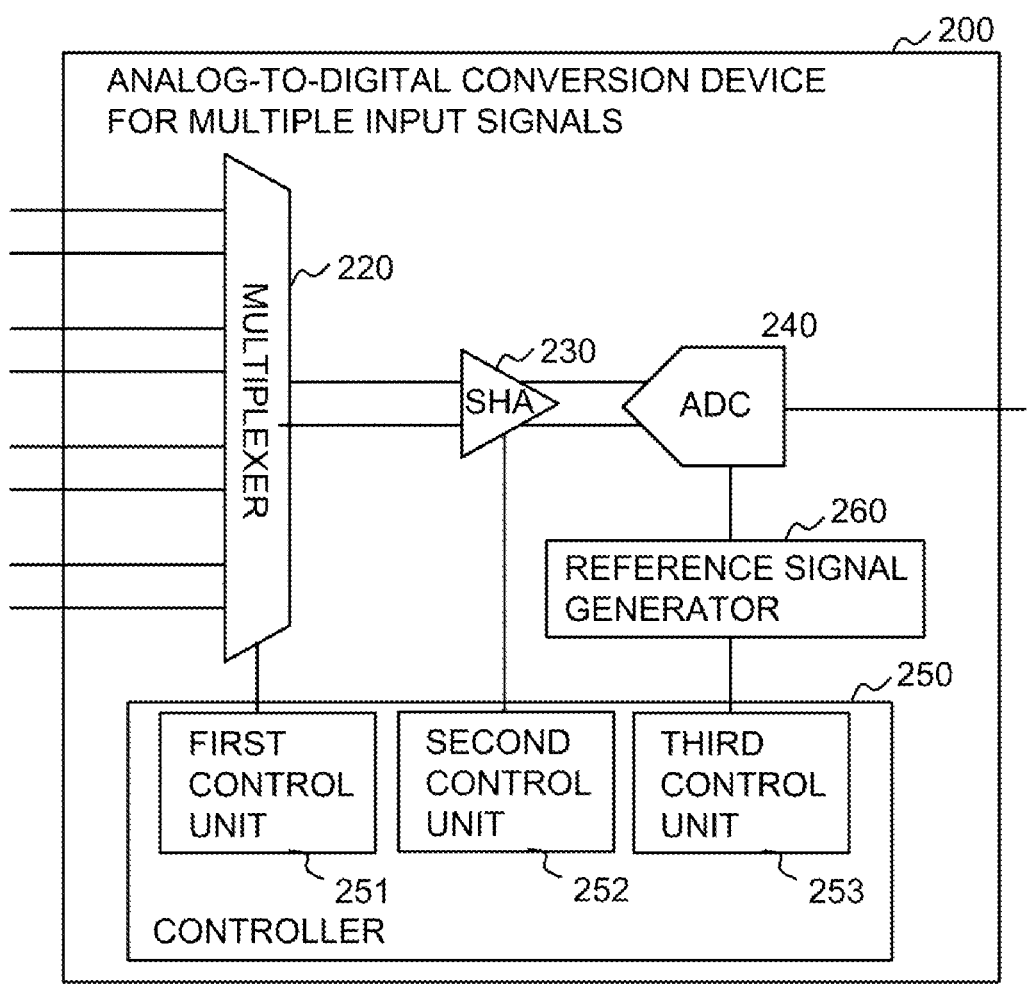
FIG. 2 is a configuration diagram of an analog-to-digital conversion device for multiple input signals according to a preferred embodiment of the present invention.

First, FIG. 2 shows a configuration diagram of an analog-to-digital conversion device 200 for multiple input signals according to a preferred embodiment of the present invention.

As illustrated in FIG. 2, the analog-to-digital conversion device 200 for multiple input signals according to a preferred embodiment of the present invention includes a multiplexer 220, a Sample-and-Hold Amplifier (SHA) 230, an Analog-to-Digital Converter (ADC) 240, a controller 250, and a reference signal generator 260.

The multiplexer 220 is a combined circuit in which one input line is selected from among multiple input lines and is connected to a single output line, and serves to select one signal from among multiple input signals and to output the selected signal.

The SHA 230 serves to capture the signal output from the multiplexer 220 and to hold and amplify the signal before the next signal to be captured arrives. In other words, the SHA 230 serves to sample and hold a signal.

The ADC 240 serves to convert the analog signal, output from the SHA 230, into a digital signal.

The reference signal generator 260 serves to generate a reference voltage, which can be used to set the dynamic range of the ADC 240. In other words, the dynamic range of the ADC 240 is set using the reference voltage generated by the reference signal generator 260.

The controller 250 serves to control the operations of the multiplexer 220, the SHA 230, and the ADC 240. Specifically, the controller 250 is configured to include a first control unit 251 for controlling the operation of the multiplexer 220, a second control unit 252 for controlling the operation of the SHA 230, and a third control unit 253 for controlling the operation of the ADC 240. The controller 250 may be implemented using a processor, which includes an MCU, an MPU, or the like.

The first control unit 251 serves to control the multiplexer so as to select one signal from among the multiple input signals.

Figure 3:
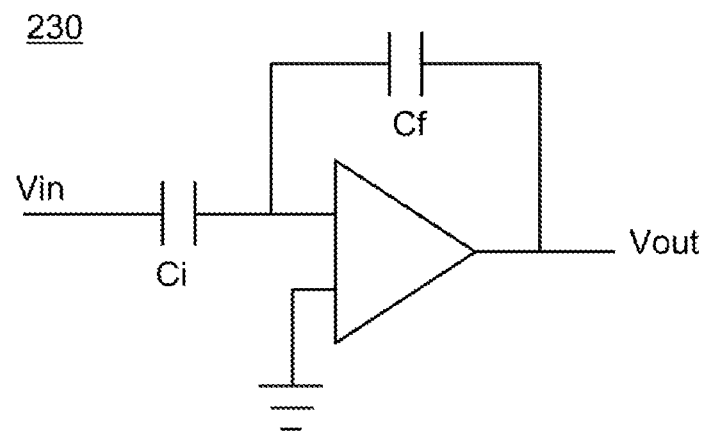
FIG. 3 is a configuration diagram of a sample-and-hold amplifier according to a preferred embodiment of the present invention.

FIG. 3 shows a configuration diagram of the sample-and-hold amplifier (SHA) 230 according to a preferred embodiment of the present invention.

The SHA 230 according to a first embodiment of the present invention includes an input capacitor Ci, located in the input terminal, and a negative feedback capacitor Cf, which forms a negative feedback path in the direction from the output terminal to the input terminal.

Here, it is desirable for at least one of the input capacitor Ci and the negative feedback capacitor Cf to be a capacitor bank C_bank, which includes multiple capacitors connected in parallel with each other.

Figure 4:
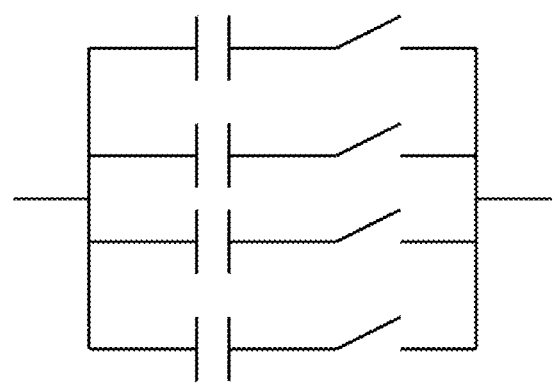
FIG. 4 is a view that shows an example of a capacitor bank.

FIG. 4 is a view that shows an example of the capacitor bank C_bank.

The second control unit 252 may control the amplification gain of the SHA 230 by controlling the on/off operation of a switch connected to each of the multiple capacitors, which are connected in parallel with each other in the capacitor bank C_bank. In other words, it is desirable for the second control unit 252 to control the amplification gain of the SHA 230 by adjusting at least one of the value of the input capacitor Ci and the value of the negative feedback capacitor Cf.

Figure 5:
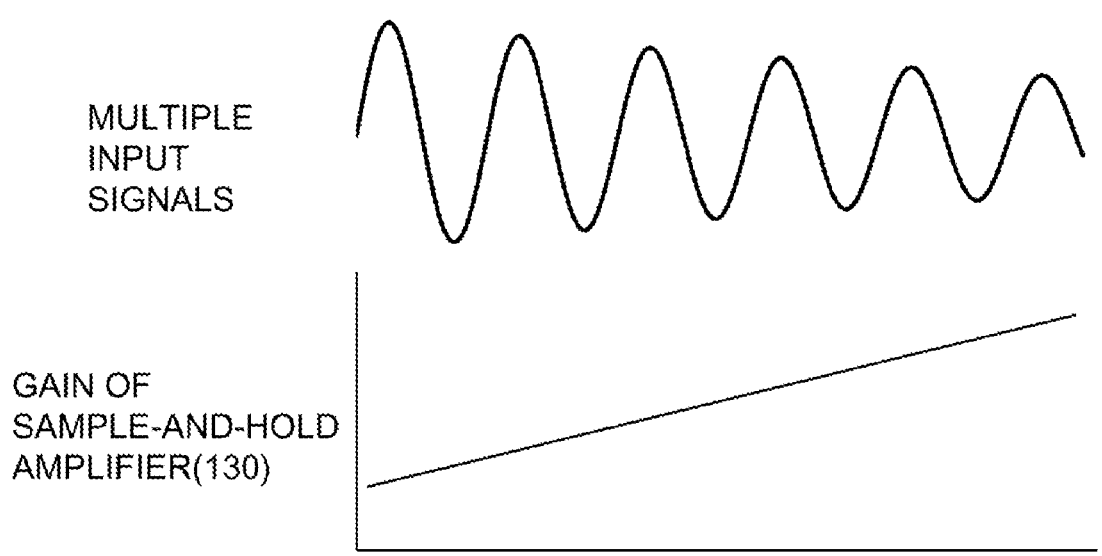
FIG. 5 is a view illustrating the relationship between the swing range of multiple input signals and the amplification gain of a sample-and-hold amplifier.

FIG. 5 is a view illustrating the relationship between the swing range of the multiple input signals and the amplification gain of the sample-and-hold amplifier (SHA) 230.

The second control unit 252 controls the amplification gain of the SHA 230 depending on the swing range of the multiple input signals, which are input to the analog-to-digital conversion device 200 of the present invention, or the swing range of the signal that is input to the SHA 230.

Specifically, the second control unit 252 controls the SHA 230 so as to operate according to a preset amplification gain depending on the swing range of the multiple input signals, which are input to the analog-to-digital conversion device 200 of the present invention, or the swing range of the signal input to the SHA 230. Here, the second control unit 252 controls the SHA 230 so as to decrease the amplification gain thereof as the swing range of the multiple input signals, which are input to the analog-to-digital conversion device 200, increases, or as the swing range of the signal input to the SHA 230 increases. In other words, the second control unit 252 controls the SHA 230 so as to increase the amplification gain thereof as the swing range of the multiple input signals, which are input to the analog-to-digital conversion device 200, decreases or as the swing range of the signal input to the SHA 230 decreases.

Additionally, when the amplification gain of the SHA 230 is decreased, it is desirable that the second control unit 252 controls the SHA 230 so as to decrease at least one of the bias current of the SHA 230 and the current that flows in the output buffer of the SHA 230. In other words, when the amplification gain of the SHA 230 is increased, the second control unit 252 controls the SHA 230 so as to increase at least one of the bias current of the SHA 230 and the current that flows in the output buffer of the SHA 230. The reason is that the output operation of the SHA 230 may be performed normally even if high current is not consumed when the amplification gain of the SHA 230 is decreased. Similarly, when the amplification gain of the SHA 230 is increased, the output operation of the SHA 230 may be performed normally using high current.

Also, if the swing range of the signal output from the SHA 230 decreases, the second control unit 252 may increase the sampling speed of the SHA 230. In order to increase the sampling speed, the second control unit 252 needs to increase at least one of the bias current of the SHA 230 and the current that flows in the output buffer of the SHA 230. Conversely, if the swing range of the signal output from the SHA 230 increases, the second control unit 252 needs to decrease the sampling speed of the SHA 230. In order to decrease the sampling speed, the second control unit 252 needs to decrease at least one of the bias current of the SHA 230 and the current that flows in the output buffer of the SHA 230.

Figure 6:
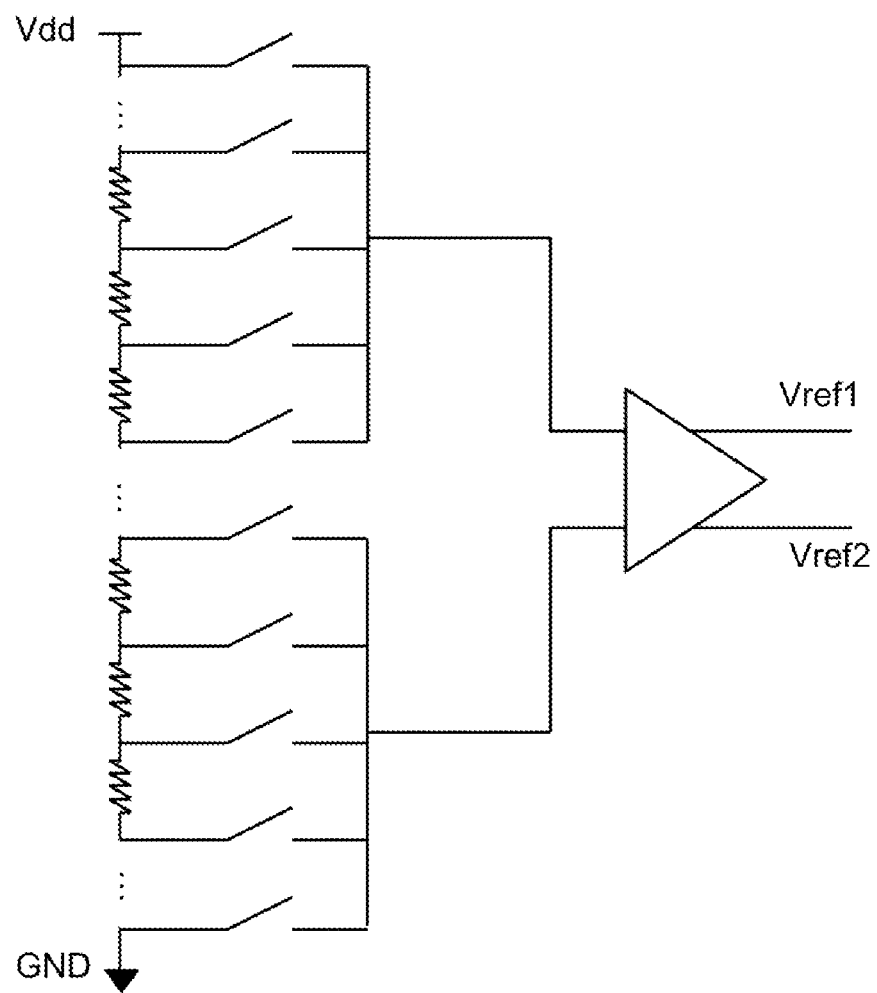
FIG. 6 is a configuration diagram of a reference signal generator according to a preferred embodiment of the present invention.

FIG. 6 is a configuration diagram of the reference signal generator 260 according to a preferred embodiment of the present invention.

As illustrated in FIG. 6, the reference signal generator 260 according to a preferred embodiment of the present invention includes multiple resistors connected in series with each other, a buffer, and multiple switches for connecting each of the first input and the second input of the buffer to a single node selected from among multiple nodes placed between the multiple resistors. The third control unit 253 controls the on/off operations of these switches, whereby the upper limit Vref1 and the lower limit Vref2 of the dynamic range of the ADC 240 are set.

The third control unit 253 controls the on/off operations of the switches of the reference signal generator 260 depending on the swing range of the signal output from the SHA 230, and thereby adjusts the reference voltage.

Specifically, if the swing range of the signal output from the SHA 230 decreases, the third control unit 253 adjusts the reference voltage so as to decrease the dynamic range of the ADC 240. Also, if the swing range of the signal output from the SHA 230 increases, the third control unit 253 adjusts the reference voltage so as to increase the dynamic range of the ADC 240.

Hereinafter, an analog-to-digital conversion method according to a preferred embodiment of the present invention will be described. Because the analog-to-digital conversion method according to a preferred embodiment of the present invention uses the above-described analog-to-digital conversion device 200, all the characteristics of the above-described analog-to-digital conversion device 200 are to be understood as being included in the method without any additional description.

The analog-to-digital conversion method according to a preferred embodiment of the present invention includes selecting one signal from among the multiple input signals and outputting the selected signal using the multiplexer 220 at step S100, sampling and holding the signal using the sample-and-hold amplifier (SHA) 230 at step S200, converting the analog signal, output at step S200, into a digital signal using the analog-to-digital converter (ADC) 240 at step S300, and generating a reference voltage, which may be used to set the dynamic range of the ADC 240, at step S400.

Specifically, it is desirable for step S200 to include controlling the amplification gain of the SHA 230 at step S210 and controlling at least one of the bias current of the SHA 230 and the current that flows in the output buffer of the SHA 230 at step S220.

Additionally, step S210 is configured such that the amplification gain of the SHA 230 is controlled using the swing range of the multiple input signals, which are input to the analog-to-digital conversion device 200, or the swing range of the signal input to the SHA 230. Desirably, step S210 is configured such that the amplification gain of the SHA 230 is decreased with an increase in the swing range of the multiple input signals, which are input to the analog-to-digital conversion device 200, or an increase in the swing range of the signal input to the SHA 230.

Also, step S220 is configured such that at least one of the bias current of the SHA 230 and the current that flows in the output buffer of the SHA 230 is controlled so as to decrease when the amplification gain of the SHA 230 is decreased. Desirably, step S220 is configured to perform control so as to increase at least one of the bias current of the SHA 230 and the current that flows in the output buffer of the SHA 230 when the amplification gain of the SHA 230 is increased.

At step S400, it is desirable for the reference voltage to be adjusted depending on the swing range of the signal output from the SHA 230. In other words, at step S400, if the swing range of the signal output from the SHA 230 decreases, the reference voltage is adjusted so as to decrease the dynamic range of the ADC 240. Conversely, if the swing range of the signal output from the SHA 230 increases, the reference voltage is adjusted in order to increase the dynamic range of the ADC 240.

As described above, the analog-to-digital conversion device for multiple input signals and the conversion method therefor according to the present invention may optimally set the dynamic range of an analog-to-digital converter depending on the input signals and may reduce the consumption of current, even if input buffers are not provided therein.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:
1. An analog-to-digital conversion device, comprising:
a sample-and-hold amplifier;
an analog-to-digital converter for converting an analog signal, output from the sample-and-hold amplifier, into a digital signal, wherein an amplification gain of the sample-and-hold amplifier is controllable; and a reference signal generator for generating a reference voltage that is capable of being used to set a dynamic range of the analog-to-digital converter, wherein the reference voltage is adjusted depending on a swing range of a signal output from the sample-and-hold amplifier.

2. The analog-to-digital conversion device of claim 1, wherein the sample-and-hold amplifier comprises:

an input capacitor, located in an input terminal; and a negative feedback capacitor, which forms a negative feedback path in a direction from an output terminal to the input terminal, wherein at least one of the input capacitor and the negative feedback capacitor is a capacitor bank that includes multiple capacitors, which are connected in parallel with each other.

3. The analog-to-digital conversion device of claim 2, wherein the amplification gain of the sample-and-hold amplifier is controllable by controlling an on/off operation of a switch connected to each of the multiple capacitors, connected in parallel with each other in the capacitor bank.

4. The analog-to-digital conversion device of claim 1, wherein the amplification gain of the sample-and-hold amplifier is controllable using a swing range of multiple input signals, which are input to the analog-to-digital conversion device, or a swing range of a signal input to the sample-and-hold amplifier.

5. The analog-to-digital conversion device of claim 4, wherein the amplification gain of the sample-and-hold amplifier decreases with an increase in the swing range of the multiple input signals, which are input to the analog-to-digital conversion device, or an increase in the swing range of the signal input to the sample-and-hold amplifier.

6. The analog-to-digital conversion device of claim 1, wherein at least one of a bias current of the sample-and-hold amplifier and a current that flows in an output buffer of the sample-and-hold amplifier is controllable.

7. The analog-to-digital conversion device of claim 6, wherein when the amplification gain of the sample-and-hold amplifier decreases, at least one of the bias current of the sample-and-hold amplifier and the current that flows in the output buffer of the sample-and-hold amplifier is controlled so as to decrease.

8. The analog-to-digital conversion device of claim 7, wherein when the amplification gain of the sample-and-hold amplifier increases, at least one of the bias current of the sample-and-hold amplifier and the current that flows in the output buffer of the sample-and-hold amplifier is controlled so as to increase.

9. The analog-to-digital conversion device of claim 1, wherein if the swing range of the signal output from the sample-and-hold amplifier decreases, the reference voltage is adjusted so as to decrease the dynamic range of the analog-to-digital converter, and if the swing range of the signal output from the sample-and-hold amplifier increases, the reference voltage is adjusted so as to increase the dynamic range of the analog-to-digital converter.

10. An analog-to-digital conversion method using an analog-to-digital conversion device, which includes a sample-and-hold amplifier and an analog-to-digital converter, comprising:

(a) sampling and holding a signal using the sample-and-hold amplifier;

(b) converting an analog signal, output at (a), into a digital signal using the analog-to-digital converter; and (c) generating a reference voltage that is capable of being used to set a dynamic range of the analog-to-digital converter, wherein (a) comprises (a-1) controlling an amplification gain of the sample-and-hold amplifier, and the reference voltage is adjusted depending on a swing range of a signal output from the sample-and-hold amplifier.

11. The analog-to-digital conversion method of claim 10, wherein (a-1) is configured such that the amplification gain of the sample-and-hold amplifier is controlled using a swing range of multiple input signals, which are input to the analog-to-digital conversion device, or a swing range of a signal input to the sample-and-hold amplifier.

12. The analog-to-digital conversion method of claim 11, wherein (a-1) is configured such that the amplification gain of the sample-and-hold amplifier is decreased with an increase in the swing range of the multiple input signals, which are input to the analog-to-digital conversion device, or an increase in the swing range of the signal input to the sample-and-hold amplifier.

13. The analog-to-digital conversion method of claim 10, wherein (a) further comprises (a-2) controlling at least one of a bias current of the sample-and-hold amplifier and a current that flows in an output buffer of the sample-and-hold amplifier.

14. The analog-to-digital conversion method of claim 13, wherein (a-2) is configured such that when the amplification gain of the sample-and-hold amplifier decreases, at least one of the bias current of the sample-and-hold amplifier and the current that flows in the output buffer of the sample-and-hold amplifier is controlled so as to decrease.

15. The analog-to-digital conversion method of claim 14, wherein (a-2) is configured such that when the amplification gain of the sample-and-hold amplifier increases, at least one of the bias current of the sample-and-hold amplifier and the current that flows in the output buffer of the sample-and-hold amplifier is controlled so as to increase.

16. The analog-to-digital conversion method of claim 10, wherein if the swing range of the signal output from the sample-and-hold amplifier decreases, the reference voltage is adjusted so as to decrease the dynamic range of the analog-to-digital converter, and if the swing range of the signal output from the sample-and-hold amplifier increases, the reference voltage is adjusted so as to increase the dynamic range of the analog-to-digital converter.

* * * * *